(12) United States Patent
Kim et al.

(10) Patent No.: US 8,004,059 B2
(45) Date of Patent: Aug. 23, 2011

(54) EFUSE CONTAINING SIGE STACK

(75) Inventors: Deok-Kee Kim, Bedford Hills, NY (US); Dureseti Chidambarrao, Weston, CT (US); William K. Henson, Peekskill, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 11/622,616

(22) Filed: Jan. 12, 2007

(65) Prior Publication Data
US 2008/0169529 A1 Jul. 17, 2008

(51) Int. Cl.
*H01L 23/525* (2006.01)
(52) U.S. Cl. .................. 257/529; 257/E23.149
(58) Field of Classification Search ........... 257/E23.149, 257/528–530
See application file for complete search history.

(56) References Cited

U.S. PATENT DOCUMENTS

| | | | |
|---|---|---|---|
| 5,412,593 A | 5/1995 | Magel et al. | |
| 6,184,105 B1 * | 2/2001 | Liu et al. | 438/424 |
| 6,368,902 B1 | 4/2002 | Kothandaraman et al. | |
| 6,432,760 B1 | 8/2002 | Kothandaraman et al. | |
| 6,617,914 B1 | 9/2003 | Kothandaraman | |
| 6,624,499 B2 | 9/2003 | Kothandaraman et al. | |
| 6,661,330 B1 | 12/2003 | Young | |
| 6,710,640 B1 | 3/2004 | Kothandaraman et al. | |
| 7,067,359 B2 * | 6/2006 | Wu | 438/132 |
| 7,132,322 B1 | 11/2006 | Greene et al. | |
| 2006/0087001 A1 | 4/2006 | Kothandaraman et al. | |
| 2006/0108662 A1 | 5/2006 | Kothandaraman et al. | |
| 2006/0131743 A1 | 6/2006 | Erickson et al. | |
| 2006/0136751 A1 | 6/2006 | Bonaccio et al. | |
| 2006/0136858 A1 | 6/2006 | Erickson et al. | |
| 2006/0158239 A1 | 7/2006 | Bhushan et al. | |
| 2006/0197179 A1 | 9/2006 | Park et al. | |
| 2006/0278895 A1 | 12/2006 | Burr et al. | |
| 2006/0278932 A1 | 12/2006 | Kothandaraman et al. | |
| 2007/0082431 A1 * | 4/2007 | Hoefler et al. | 438/128 |

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.

* cited by examiner

*Primary Examiner* — Colleen A Matthews
(74) *Attorney, Agent, or Firm* — Scully, Scott, Murphy & Presser, P.C.; Joseph P. Abate, Esq.

(57) ABSTRACT

An eFuse, includes: a substrate and an insulating layer disposed on the substrate; a first layer including a single crystal or polycrystalline silicon disposed on the insulating layer; a second layer including a single crystal or polycrystalline silicon germanium disposed on the first layer, and a third layer including a silicide disposed on the second layer. The Ge has a final concentration in a range of approximately five percent to approximately twenty-five percent.

17 Claims, 11 Drawing Sheets

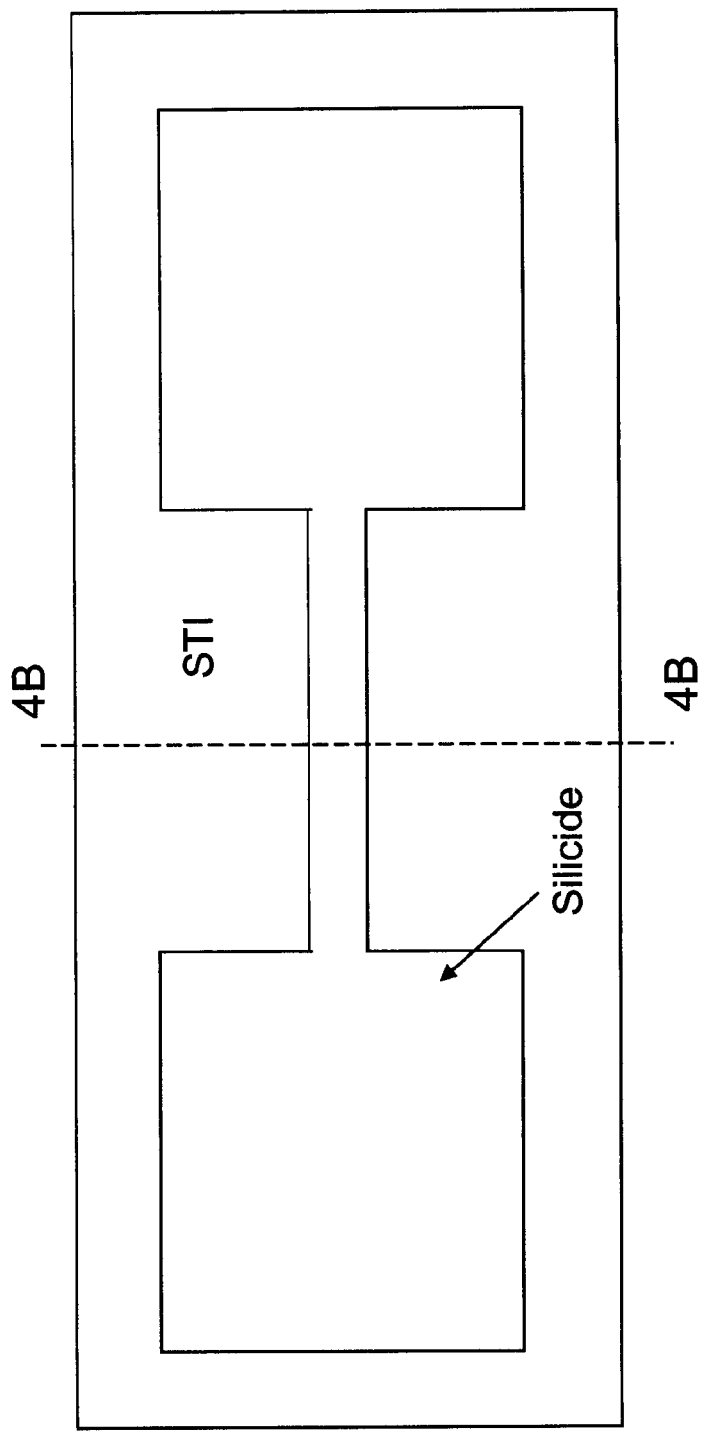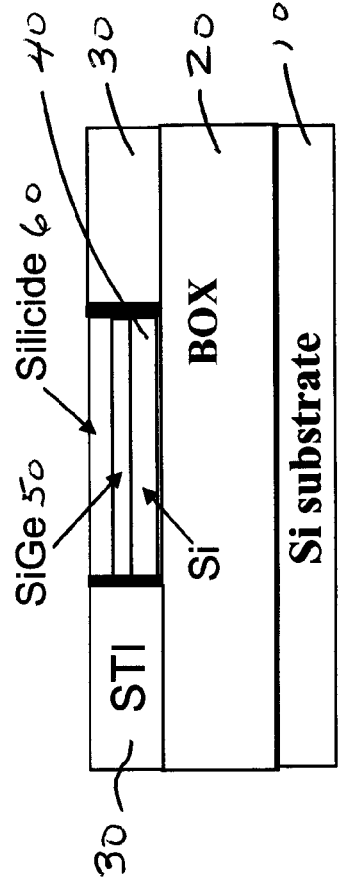
Figure 4A
Figure 4B

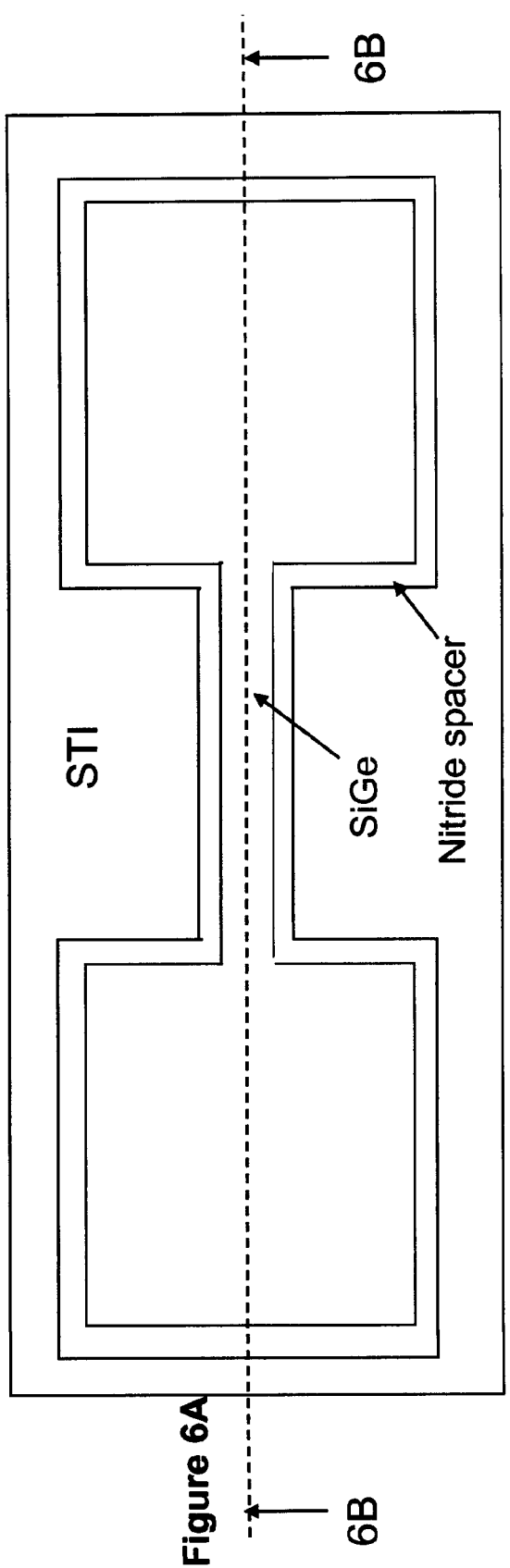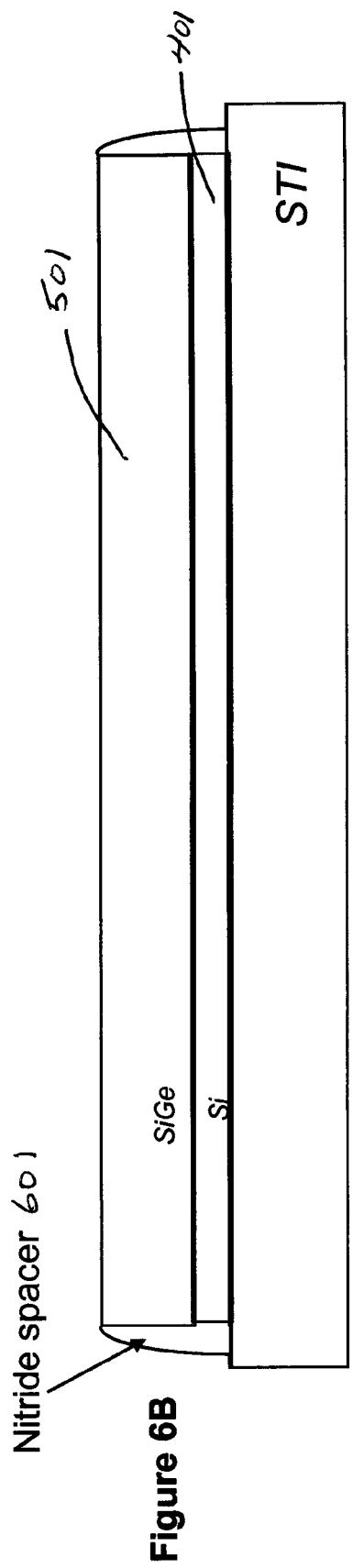

EFUSE CONTAINING SIGE STACK

BACKGROUND OF THE INVENTION

1. Technical Field of the Invention

The invention relates generally to the field of integrated circuits and, more particularly, to eFuse.

2. Description of Related Art

In integrated circuits including CMOS integrated circuits, it is often desirable to be able to permanently store information, or to form permanent connections of the integrated circuit after it is manufactured. Fuses or devices forming fusible links are frequently used for this purpose. Fuses can also be used to program redundant elements to replace identical defective elements, for example. Further, fuses can be used to store die identification or other such information, or to adjust the speed of a circuit by adjusting the resistance of the current path.

One type of fuse device is "programmed" or "blown" using a laser to open a link after a semiconductor device is processed and passivated. This type of fuse device requires precise alignment of the laser on the fuse device to avoid destroying neighboring devices. This and other similar approaches can result in damage to the device passivation layer, and thus, lead to reliability concerns. For example, the process of blowing the fuse can cause a hole in the passivation layer when the fuse material is displaced.

Another type of fuse device 30, illustrated in plan view in FIG. 1A and cross-section view in FIG. 1B through line A-A', and cross-section view in FIG. 1C through line B-B', is based on rupture or agglomeration or electromigration of silicided polysilicon. These type of fuses include a silicide layer 20 disposed on a polysilicon layer 18, overlain by a layer of silicon nitride 24. Contacts 25 are coupled to the silicide layer 20 in a pair of contact regions 22 on either side of a fuse element 27 to provide an electrical connection between the fuse and external components for programming and sensing. FIG. 1A illustrates a top view of the typical shape and includes the fuse element 27 and contact regions 22. Conventional signal (e.g. voltage) sensing circuitry is also shown schematically.

FIG. 1B shows a side view of a typical fuse construction in which the polysilicon layer 18 and the silicide layer 20 are provided at a uniform thickness disposed on an oxide layer 10 also of a uniform thickness, and FIG. 1C illustrates a cross-section through the fuse link region 27. Generally, a blanket nitride capping layer 24 is also provided over layers 20 and 22.

The silicide layer 20 has a first resistance and the polysilicon layer 18 has a second resistance which is greater than the first resistance. In an intact condition, the fuse link has a resistance determined by the resistance of the silicide layer 20. In common applications, when a programming potential is applied, providing a requisite current and voltage over time, across the fuse element 27 via the contact regions 22, the silicide layer 20 begins to randomly "ball-up" eventually causing an electrical discontinuity or rupture in some part of the silicide layer 20. Thus, the fuse link 27 has a resultant resistance determined by that of the polysilicon layer 18 (i.e. the programmed fuse resistance is increased to that of the second resistance). However, this type of fuse device can result in damage to surrounding structure and/or suffers from unreliable sensing because of the inconsistent nature of the rupture process and the relatively small change typically offered in the programmed resistance. Further, these type of devices may not be viable for use with many of the latest process technologies because of the required programming potentials, i.e. current flow and voltage levels over a requisite amount of time.

In the electromigration type of fuse, a potential is applied across the conductive fuse link via the cathode and anode in which the potential is of a magnitude and direction to initiate electromigration of silicide from a region of the semiconductor fuse reducing the conductivity of the fuse link. The electromigration is enhanced by commencing a temperature gradient between the fuse link and the cathode responsive to the applied potential.

See also, for example, U.S. Pat. No. 6,624,499 B2, SYSTEM FOR PROGRAMMING FUSE STRUCTURE BY ELECTROMIGRATION OF SILICIDE ENHANCED BY CREATING TEMPERATURE GRADIENT, issued Sep. 23, 2003, by Kothandaraman et al., and "Electrically Programmable Fuse (eFuse) Using Electromigration in Silicides", by Kothandaraman et al., IEEE Electron Device Letters, Vol. 23, No. 9, September 2002, pp. 523-525, which are both incorporated in their entireties herein by reference.

Even with this electromigration type of fuse, the programming of the fuse is still dominated by the polysilicon material. Because the polysilicon film contains a significant number of imperfections, the final resistance has a wide distribution. This sometimes results in a programmed fuse being sensed incorrectly and, thus, leading to the failure of the chip.

Therefore, a need exists for a programming method and apparatus which reduces the variability of programming inherent in fuses formed on polysilicon.

Furthermore, it is desirable to reduce the energy required to program the fuse. It is also preferable to have a significant difference in resistance between the programmed and the un-programmed state.

Also, there is a need to shrink the area occupied by the support circuitry.

SUMMARY OF THE INVENTION

The present invention is directed to an electrically programmable fuse comprising a silicide layer, a SiGe layer, and a silicon layer. The SiGe and silicon layers can be either single crystalline or poly crystalline. The silicide is disposed or formed onto the SiGe layer. The silicide, SiGe and silicon layers form a fuse link region electrically connected to a first contact region at a first end of the fuse link region and a second contact region at the opposing end of the fuse link region. The substrate can be either silicon-on-insulator or bulk silicon wafers.

The fuse of the present invention has the advantage that it can be successfully programmed over a wide range of programming voltages and time. The thermal conductivity of Si is 1.3 W/cm K and that of SiGe is 0.1 W/cm K. The SiGe layer below silicide provides much improved thermal insulation required for successful programming without special control effort.

1-D thermal diffusion equation is as follows:

$$\frac{\partial T}{\partial t} = \alpha \frac{\partial^2 T}{\partial x^2}, \text{ where } \alpha = \frac{k}{\rho c_p}$$

(thermal diffusivity) and
k, $\rho$ and $e_p$ (thermal conductivity, density, specific heat)

Thermal diffusivity of Si is 0.8 cm$^2$/sec and that of SiGe is 0.36 cm$^2$/sec. Electromigration, which is the diffusion of atoms due to electron wind force, is easier with the lower melting temperature of SiGe compared to Si. The SiGe layer below silicide improves eFuse programming in at least three ways: lower thermal conductivity, lower thermal diffusivity, and lower melting temperature. The maximum temperature in the fuse link (for the same geometry and current density) is achieved much easier with SiGe layer below silicide. The voltage, current and time needed to program the inventive fuse are small, which results in significant savings in area.

BRIEF DESCRIPTION OF THE DRAWINGS

For a more complete understanding of the present invention, reference is made to the following detailed description taken in conjunction with the accompanying drawings, which are not necessarily drawn to scale, wherein:

FIG. 4A is a top plan view of a further intermediate structure for forming a fuse (first embodiment) of the present invention;

FIG. 4B is a cross-sectional view through the dashed line 4B-4B;

FIG. 6A is a top plan view of an initial structure for forming a second embodiment;

FIG. 6B is a cross-sectional view through the dashed line 6B-6B;

DETAILED DESCRIPTION

Figure 1A:
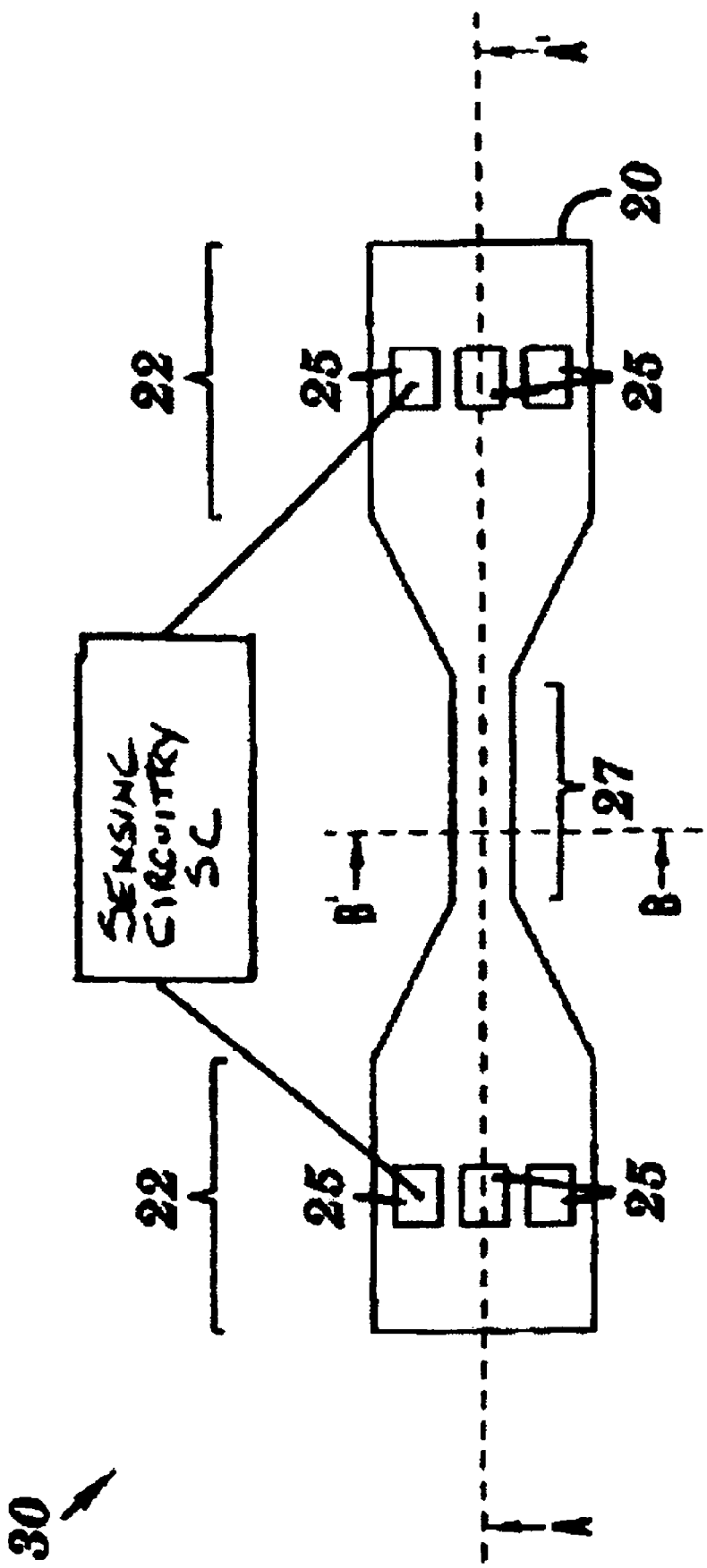
FIG. 1A illustrates a plan view of a conventional fusible link device.
Figure 1B:
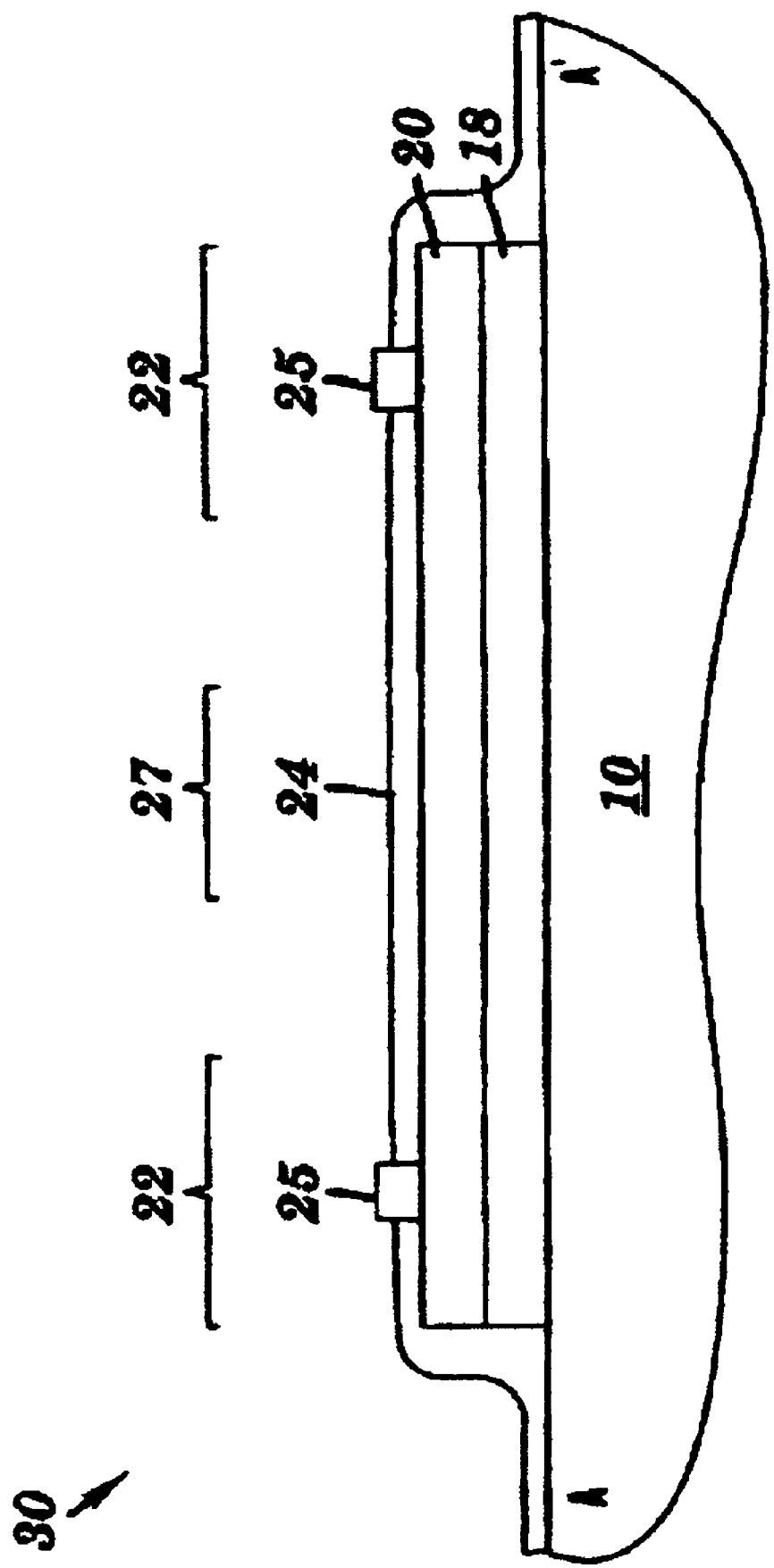
FIG. 1B illustrates a cross-sectional view of a conventional fusible link device.
Figure 1C:
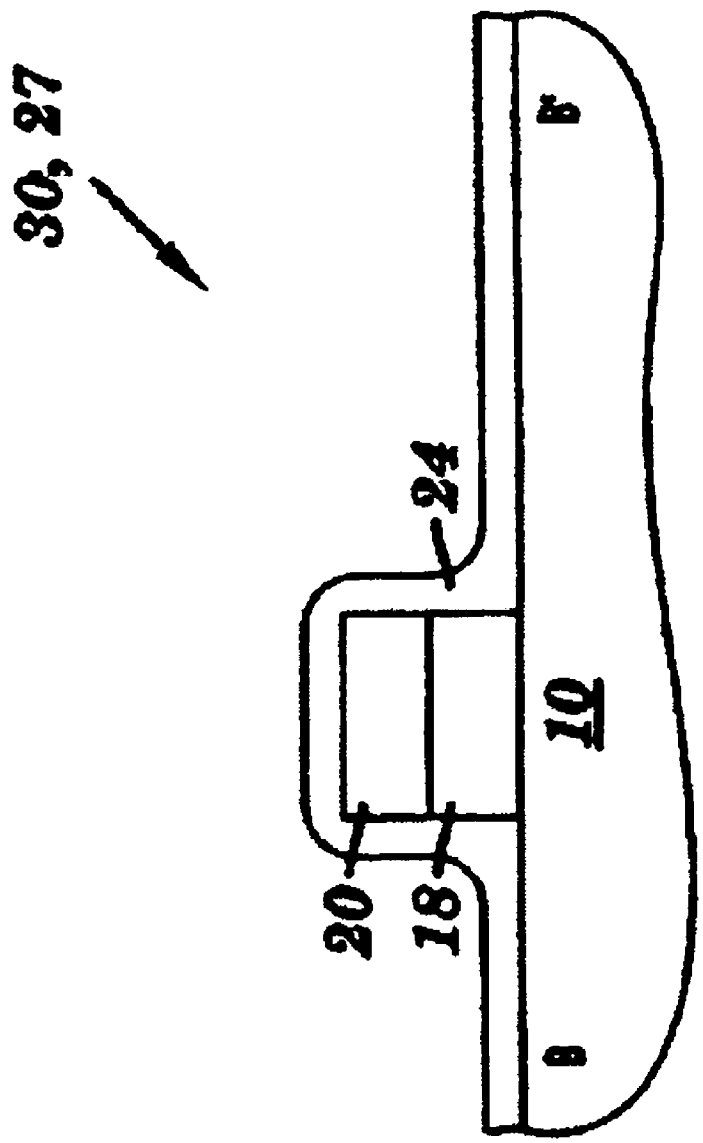
FIG. 1C illustrates a cross-sectional view of a conventional fusible link device.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity. The drawings are provided to aid in understanding the present invention, and are not necessarily drawn to scale.

The present invention is directed to an electrically programmable fuse including a silicide layer, a SiGe layer, and a silicon layer. The SiGe and silicon layers can be either single crystalline or poly crystalline. The silicide is disposed or formed onto the SiGe layer. The silicide, SiGe and silicon layers form a fuse link region electrically connected to a first contact region at a first end of the fuse link region and a second contact region at the opposing end of the fuse link region. The substrate can be either silicon-on-insulator or bulk silicon wafers.

The fuse of the present invention has the advantage that it can be successfully programmed over a wide range of programming voltages and time. The thermal conductivity of Si is 1.3 W/cm K and that of SiGe is 0.1 W/cm K. The SiGe layer below silicide provides much improved thermal insulation required for successful programming without special control effort.

1-D thermal diffusion equation is as follows:

$$\frac{\partial T}{\partial t} = \alpha \frac{\partial^2 T}{\partial x^2}, \text{ where } \alpha = \frac{k}{\rho c_p}$$

(thermal diffusivity) and k, $\rho$ and $e_p$ (thermal conductivity, density, specific heat)

Thermal diffusivity of Si is 0.8 cm$^2$/sec and that of SiGe is 0.36 cm$^2$/sec. Electromigration, which is the diffusion of atoms due to electron wind force, is easier with the lower melting temperature of SiGe compared to Si. The SiGe layer below silicide improves eFuse programming in at least three ways: lower thermal conductivity, lower thermal diffusivity, and lower melting temperature. The maximum temperature in the fuse link (for the same geometry and current density) is achieved much easier with SiGe layer below silicide. The voltage, current and time needed to program the inventive fuse are small, which results in significant savings in area.

Two preferred embodiments are described below. The first embodiment is shown formed on an silicon-on-insulator (SOI) substrate or wafer. However, the substrate can either be SOI or bulk silicon wafer. The fuse according to the first embodiment of the invention includes a silicide layer 60, an epitaxially grown single crystal SiGe layer 50, a single crystalline silicon layer 40 and a BOX (buried oxide) layer 20. The layer 40 is formed on the layer 20, the layer 50 is formed on the layer 40, and the layer 60 is formed on the layer 50, as shown in the cross-sectional view of FIG. 4B.

FIGS. 2-5 show the process steps for forming the first embodiment. The fuse in the second embodiment includes a silicide, a polycrystalline SiGe, and a polycrystalline silicon on a STI (shallow trench isolation) layer. FIGS. 6-12 describe the process steps for forming the second embodiment.

Embodiment One

Figure 2A:
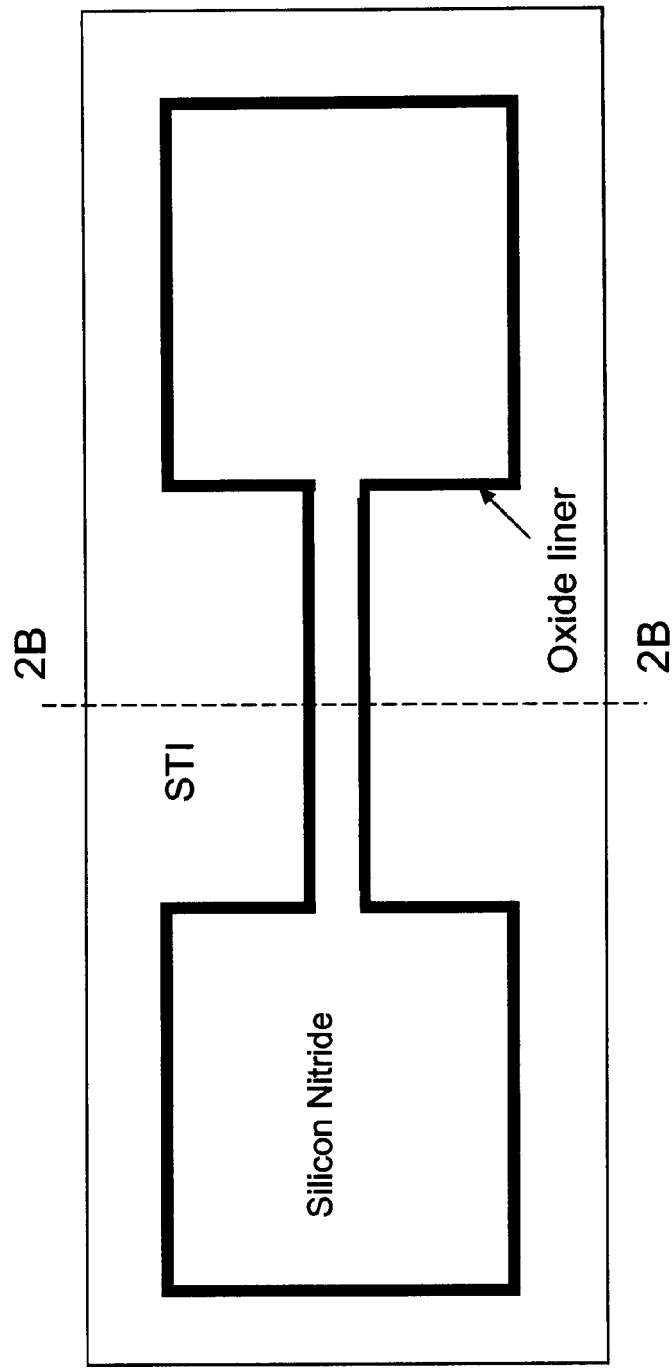
FIG. 2A is a top plan view of an initial structure for forming a fuse of the present invention.
Figure 2B:
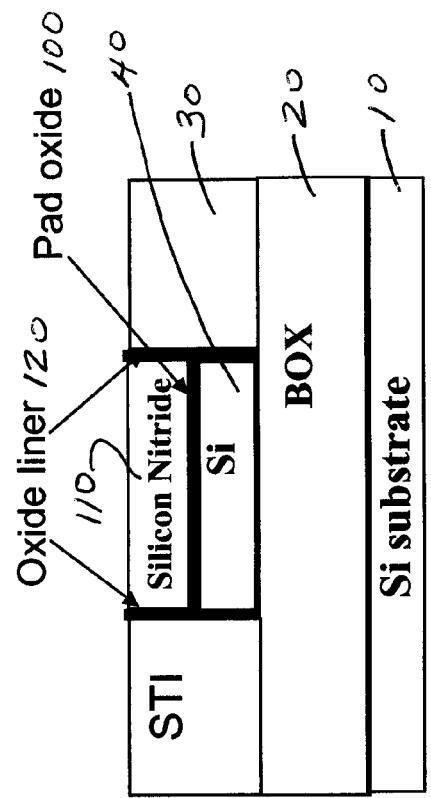
FIG. 2B is a cross-sectional view through the dashed line 2B-2B.

FIGS. 2A and 2B illustrate a plan view and a cross-sectional view of an intermediate structure for an electrically programmable fuse (hereinafter referred to as an eFuse) after a conventional shallow trench isolation (STI) formation, by well known techniques which need not be further described in accordance with the first embodiment of the present invention. A pad oxide (~50 A) 100 is conventionally grown on an SOI wafer 10, 20, 40 and a pad nitride (between 1000 A-2000 A) 110 is deposited as shown using LPCVD (low pressure chemical vapor deposition). After an area (which will form STI regions) is patterned (conventionally) and etched using RIE (reactive ion etching), a thin oxide liner 120 (~100 A) is thermally grown in a furnace (not shown) and a thin nitride liner (not shown in the figures) is deposited using LPCVD. After that, an oxide to form the STI region is deposited conventionally either by LPCVD or HDPCVD (high density plasma chemical vapor deposition). The extra oxide and nitride on top of the pad nitride 110 is removed by CMP (chemical mechanical polishing).

Figure 3A:
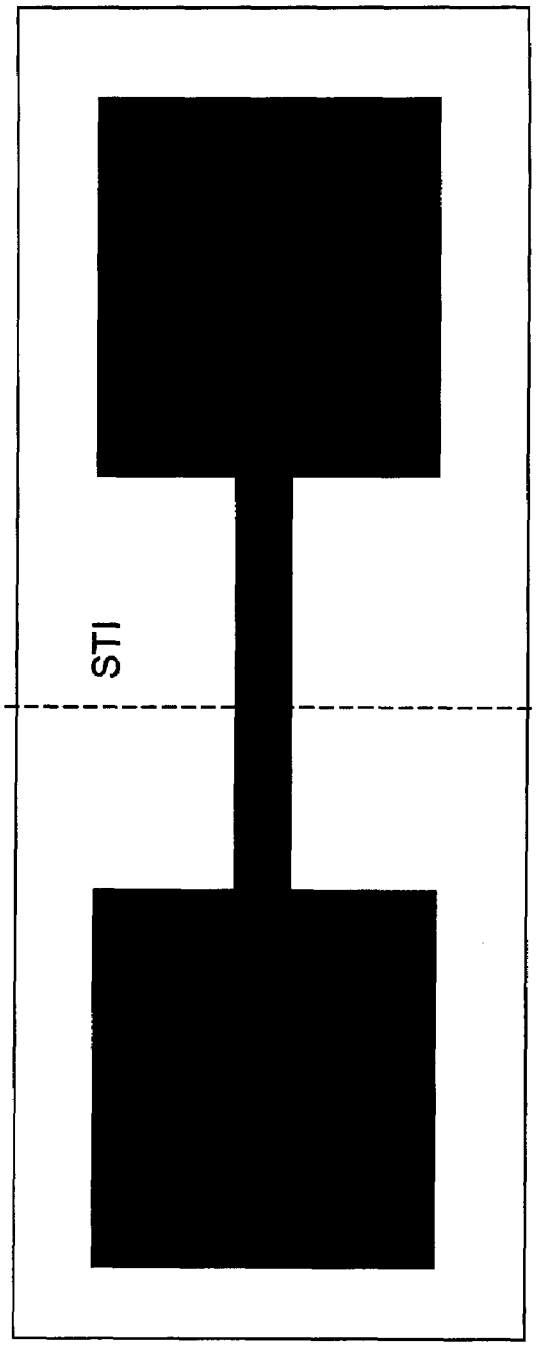
FIG. 3A is a top plan view of an intermediate structure for forming a fuse (first embodiment) of the present invention.
Figure 3B:
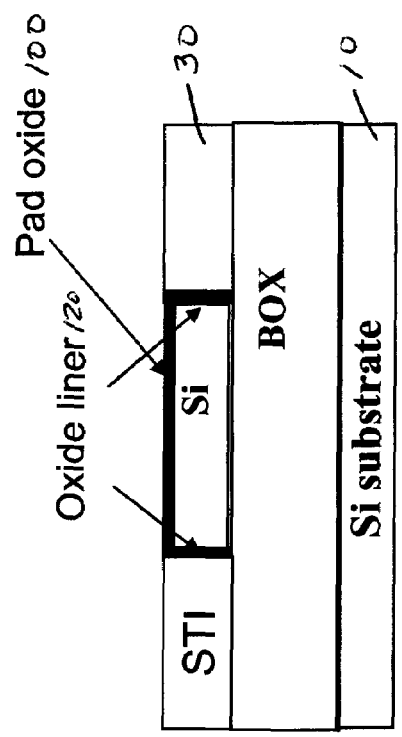
FIG. 3B is a cross-sectional view through the dashed line 3B-3B.

STI oxide is recessed approximately 10-50 nm before removing pad nitride using wet etching (hot phosphoric acid—H3PO4, etc.). The pad nitride 110 is removed and conventional polysilicon conductor formation processes including necessary carrier implants are performed in non-fuse area. The top down and cross-sectional views of an intermediate structure for an eFuse after conventional poly conductor formation are shown in FIGS. 3A and 3B; poly conductors not shown.

The area (e.g. NFET area) (not shown) that will not have eSiGe (embedded SiGe) is covered with a block layer such as LPCVD nitride (not shown). The nitride is deposited everywhere and is etched using a RIE with a block mask in the area (e.g. PFET not shown and eFuse area) that will contain the eSiGe. The oxide layer (i.e., the pad oxide is replaced with a sacrificial oxide, which is later replaced with a gate oxide) is etched before recessing the single crystal silicon. The single crystal silicon substrate (or SOI layer in SOI wafer) is recessed or etched using RIE. And then, a SiGe layer is grown on the layer 40 epitaxially using RTP (rapid thermal processing) around 700° C. The SiGe is grown to have a final concentration of Ge in a range of approximately 5% to approximately 50%. The block nitride layer is removed in a hot phosphoric acid (H3PO4). After that, a silicide layer 60 (such as NiPtSi) is formed on the SiGe layer 50. The top down and cross-sectional views of an intermediate structure for an eFuse after the silicide process are shown in FIGS. 4A and 4B.

Figure 5A:
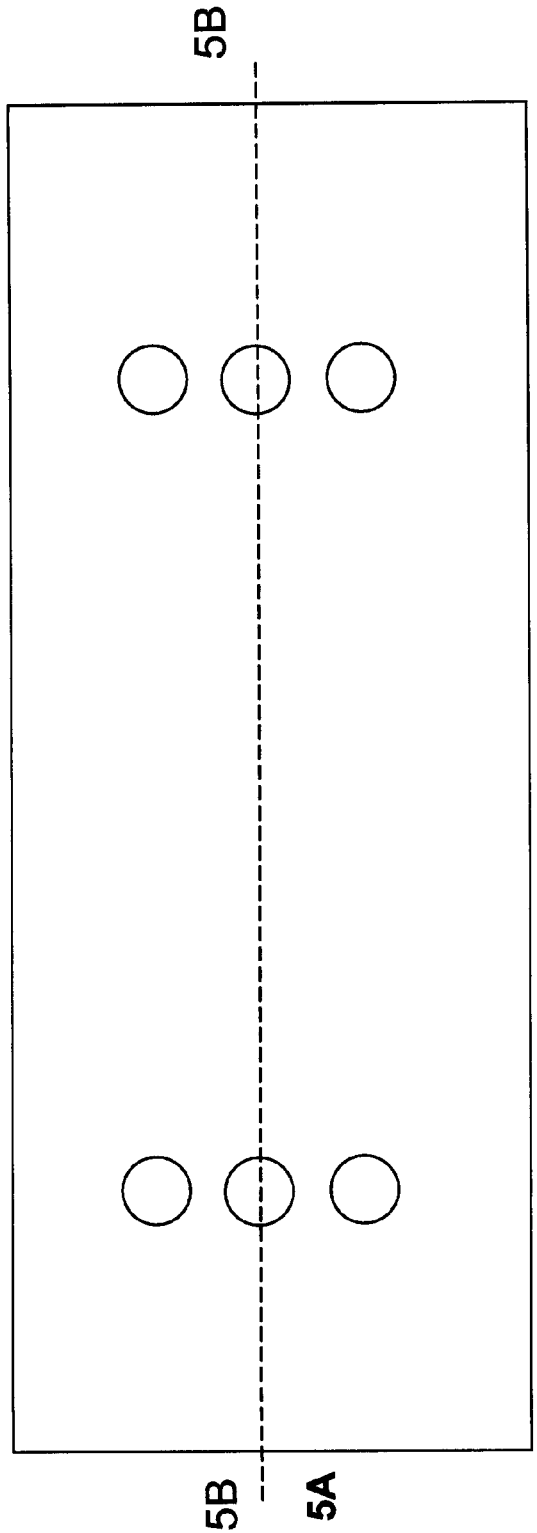
FIG. 5A is a top plan view of a final structure of a fuse according to the first embodiment.
Figure 5B:
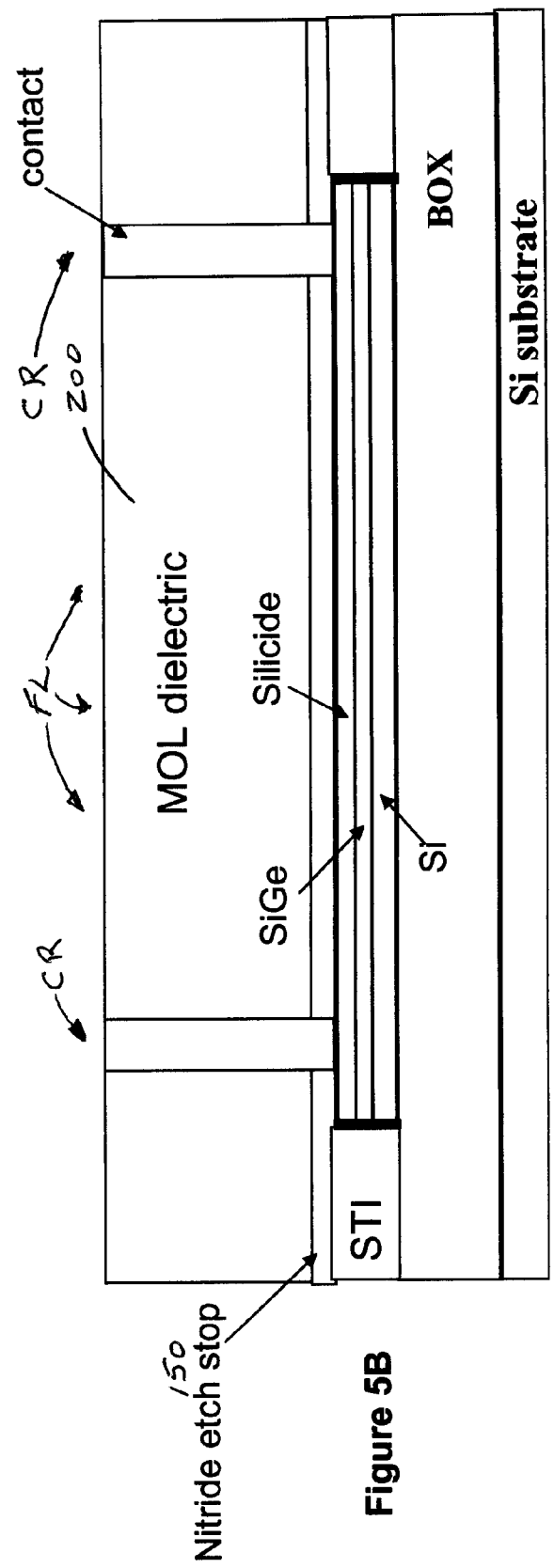
FIG. 5B is a cross-sectional view through the dashed line 5B-5B.
Figure 7A:
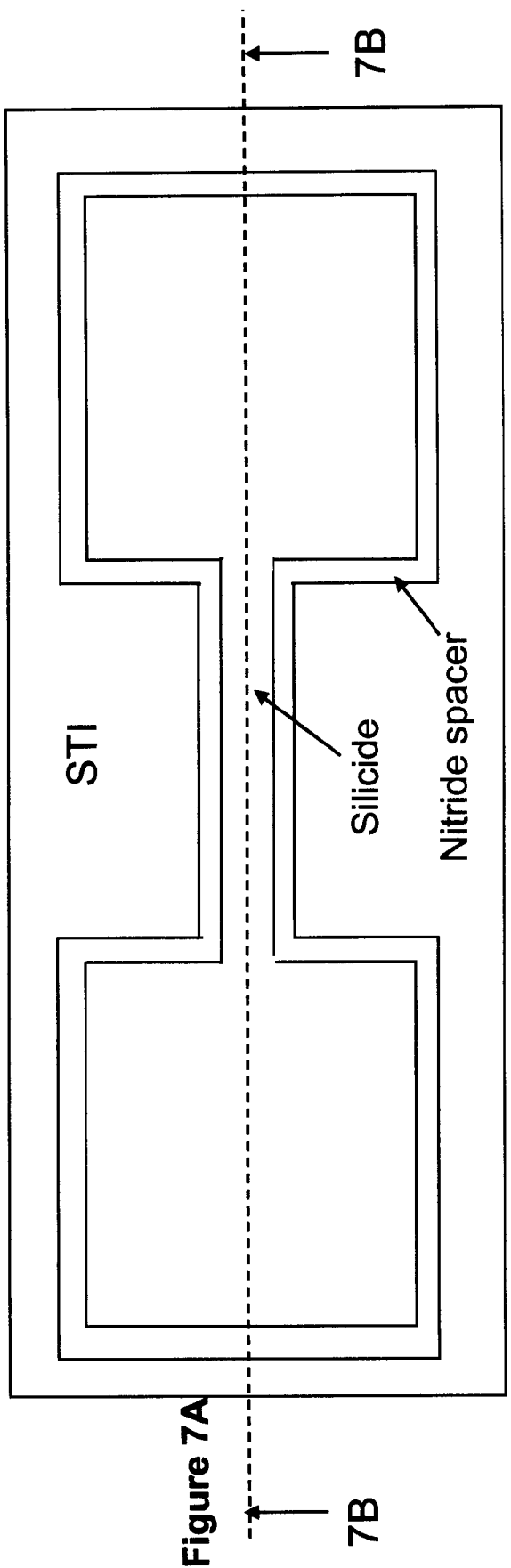
FIG. 7A is a top plan view of an intermediate structure for forming the second embodiment.
Figure 7B:
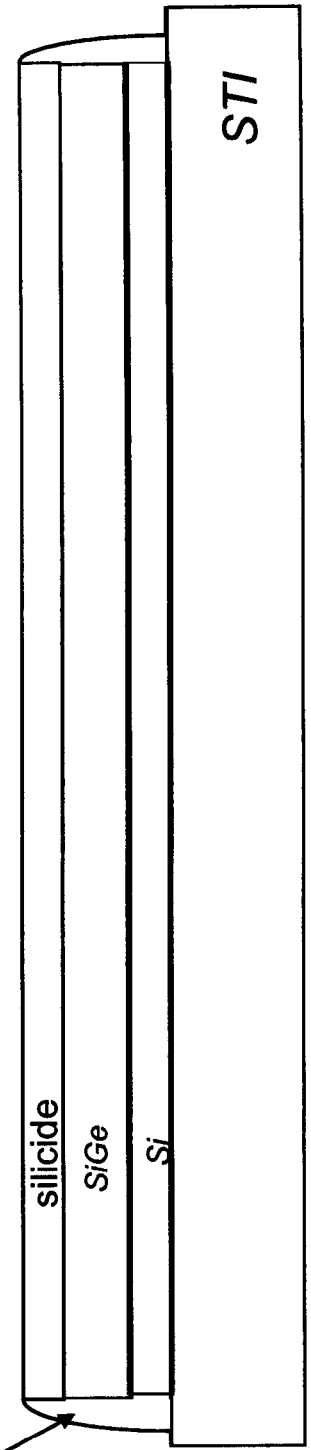
FIG. 7B is a cross-sectional view through the dashed line 7B-7B.
Figure 8A:
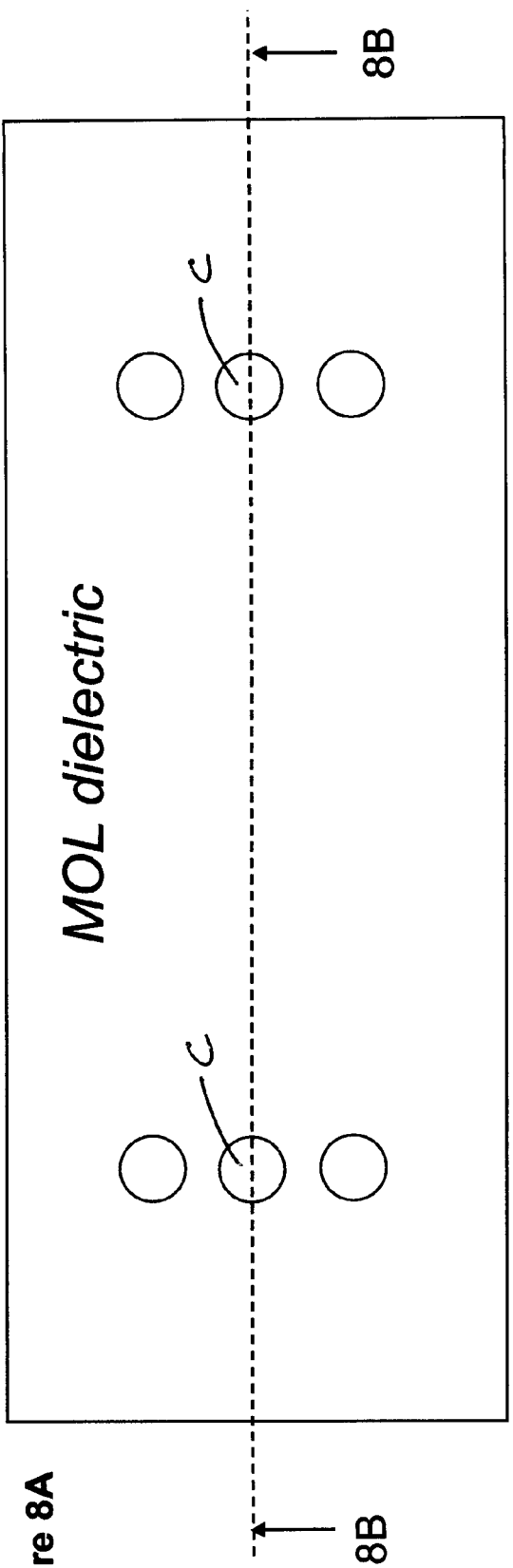
FIG. 8A is a top plan view of an intermediate structure for forming the second embodiment.
Figure 8B:
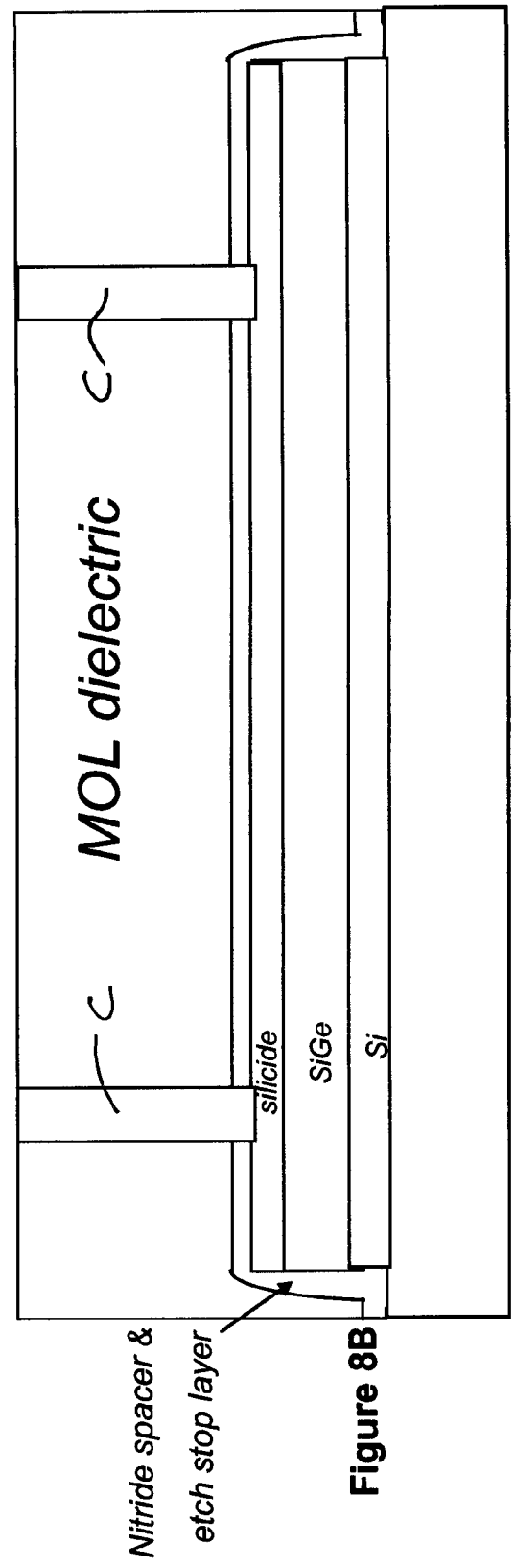
FIG. 8B is a cross-sectional view through the dashed line 8B-8B.
Figure 9A:
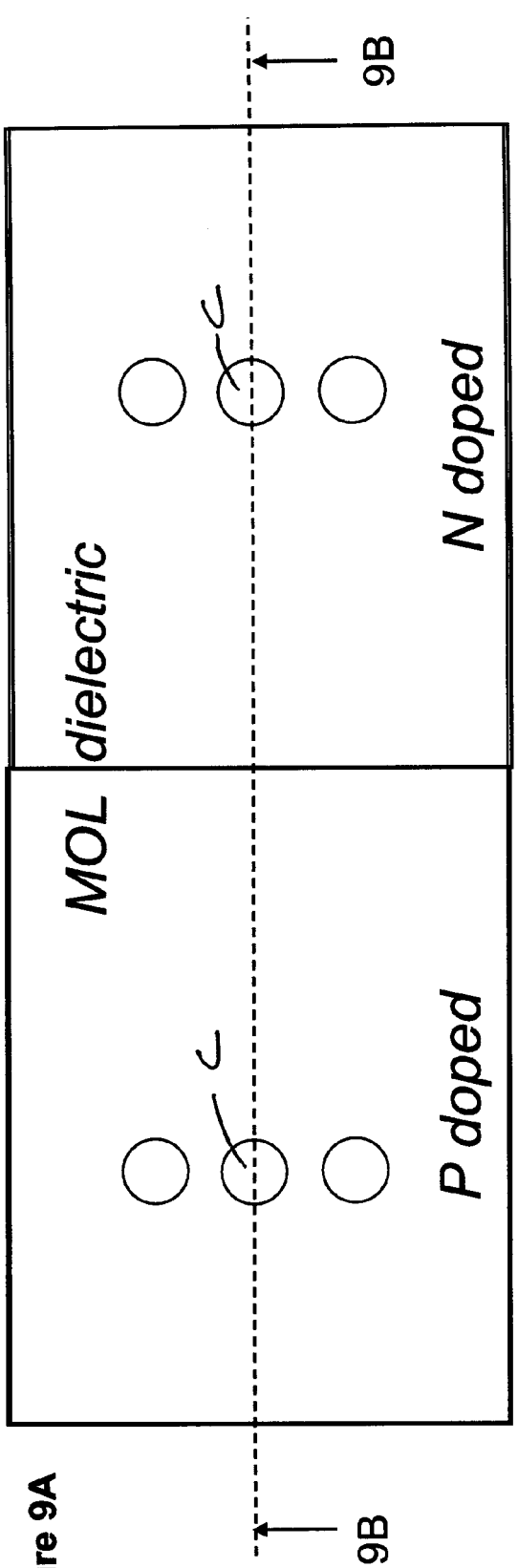
FIG. 9A is a top plan view of a variation for the second embodiment.
Figure 9B:
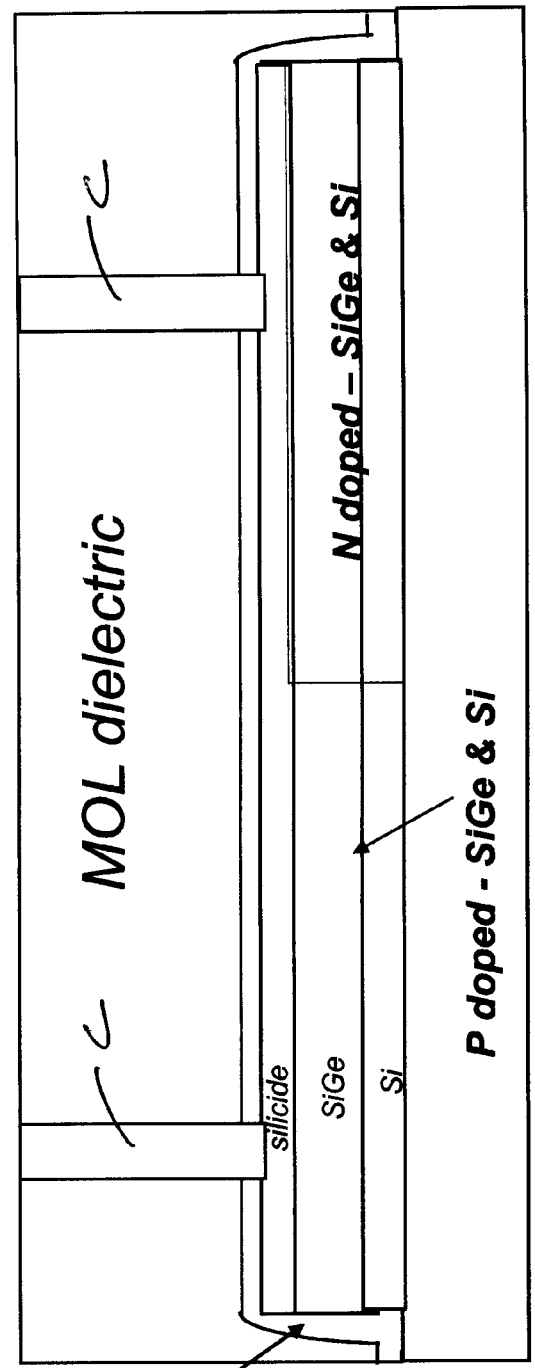
FIG. 9B is a cross-sectional view in the direction of the arrow 9B.

Etch stop nitride layer 150 is then deposited, and a middle of the line (MOL) dielectric layer 200 such as oxide or BPSG (BoroPhosphoSilicate glass) is deposited. The top down and cross-sections of an eFuse after contact formation for the first embodiment are shown in FIGS. 5A and 5B. The number of contacts is typically between one and six.

The inventive eFuse includes two contact regions CR connected by a fuse link region FL. The contact regions include at least one contact. If desired, more than one contact may be formed in the contact region, thus the contact region may be made wider than the fuse link region.

Embodiment Two

Now FIGS. 6, 11, 12 and 13 illustrate embodiment 11. Shallow trench isolation is formed following standard CMOS processing. A polycrystalline Si layer 401 and a polycrystalline SiGe layer 501 are deposited as poly conductor layers (by LPCVD). The structure is patterned while poly conductors are patterned by lithography and RIE. After that, nitride spacers 601 are formed by depositing nitride and etching using RIE. The top down and cross sections after the nitride spacer formation are shown in FIGS. 6A and 6B.

This eFuse structure with more thermally insulating SiGe below enables very easy achievement of a high and uniform final resistance, thus avoiding deleterious effects such as insufficient programming, rupture or agglomeration and avoiding collateral damage to adjacent devices. The inventive fuse structure (e.g. EMBODIMENT ONE or TWO) thus advantageously permits lower programming voltage/current and/or programming time. The eFuse structure can be formed using standard CMOS technology, without any additional masking or processing steps.

The substrate can either be an SOI wafer or Si bulk wafer for both embodiments. In a typical SOI wafer, the semiconductor is typically silicon, but any suitable semiconductor material, such as SiGe, GaAs, InP and the like may be used. An SOI wafer having a crystalline silicon layer may be formed, for example, by starting with a crystalline silicon wafer, then implanting oxygen ions, for example, to a depth between about 100 nm to 500 nm. The implanted SOI wafer is then annealed, which results in a thin layer of silicon dioxide under a thin crystalline silicon layer. Alternatively, the structure may be formed by forming an oxide layer on a first silicon wafer and an oxide layer on a second silicon wafer, wherein at least one of the silicon wafers consists of crystalline silicon, and then bonding the two wafers along the corresponding oxide layers. Note that any orientation for the crystalline semiconductor may be used, but orientations of <100> or <110> would typically be used. It should be emphasized that the crystalline silicon layer is electrically and thermally isolated from the silicon substrate.

Preferably, the SiGe and silicon layers may be implanted with a dopant, such as boron or arsenic. In yet another alternate embodiment, one side of the crystalline SiGe and silicon layers may be implanted with boron, and the other side implanted with arsenic, as illustrated in FIGS. 13A and 13B. The single-crystalline or polycrystalline SiGe and silicon may be doped with a P-type dopant or an N-type dopant, or may be doped to form a P—N junction. Optionally, a silicide layer is formed atop the SiGe layer, using techniques known in the art, such as deposition of silicide (e.g. by a polycide process), or by deposition of a metal such as tungsten, cobalt, Ti or the like, followed by an anneal. The SiGe and silicon layers may remain undoped, in which case, the silicide layer may be required to achieve the desired conductivity.

The inventive eFuse (FIGS. 5A, 5B, FIGS. 7A, 7B, FIGS. 8A, 8B or FIGS. 9A, 9B) is connected in series with a transistor having a select terminal through one of the contacts on one of the fuse contact regions. The other contact region on the opposite end of the fuse link is connected to a blow terminal through the corresponding contact. A blow potential of $V_B$ is applied to the blow terminal. When a programming signal or pulse $V_S$ is applied to the select terminal, a current will flow through the eFuse. A typical $V_B$ is in the range of 1.5 to 3.3 V. A typical select or programming signal $V_S$ is a pulse with an amplitude about 1 volt to 2.5 volts, preferably about 1 volt, with a duration of about 50 microseconds to 50 milliseconds, preferably about 200 milliseconds. The inventive eFuse automatically maintains an appropriate temperature gradient for correct programming of the fuse, over such a wide range of programming voltages and programming times, and thus has a wide tolerance to programming voltage and times. The initial resistance of the fuse link is less than about (±10%) 200Ω and more typically about 100Ω. After programming, the final resistance is greater than about 1 MΩ.

The inventive eFuse may be used in a fuse bank, which are used, for example, to permanently store information, as in a Permanent Read Only Memory (PROM). The eFuses are coupled in parallel, each connected in series to its own associated select transistor. Each eFuse is also coupled to a common blow terminal for applying the blow voltage $V_B$ in which serial latches are programmed with the pattern of fuses to be blown. Subsequent to applying the blow voltage $V_B$ to the blow terminal, appropriate digital control circuitry enables appropriate transistors, resulting in the programming of the eFuses corresponding to the pattern held in the serial latches. Appropriate sense-circuitry (e.g. SC of FIG. 1A) can be similarly integrated to read the information stored in the eFuse bank.

While the invention has been described in terms of specific embodiments, it is evident in view of the foregoing description that numerous alternatives, rearrangements, modifications, substitutions and variations will be apparent to those skilled in the art. Accordingly, the invention is intended to encompass all such alternatives, rearrangements, modifications, substitutions and variations which fall within the scope and spirit of the invention and the following claims.

What is claimed is:

1. A fuse in direct contact with an upper surface of an insulating layer disposed on and above a substrate, said fuse comprising:
   a fuse link region including a first layer, a second layer and a third layer;
   the first layer including a single crystal silicon disposed on and in direct contact with an upper surface of said insulating layer;
   the second layer consisting essentially of a single crystal silicon germanium disposed on and in direct contact with an upper surface of said first layer, and
   the third layer including a silicide disposed on and in direct contact with an upper surface of said second layer, wherein said first, second, third layers are disposed between STI regions.

2. The fuse as claimed in claim 1, said first layer consisting essentially of said single crystal silicon.

3. The fuse as claimed in claim 1, said third layer consisting essentially of said single crystal silicon.

4. The fuse as claimed in claim 1, said substrate consisting essentially of a bulk silicon substrate.

5. The fuse as claimed in claim 1, said second layer including single crystal silicon germanium having a Ge concentration of approximately 20%, and said first layer consisting essentially of said single crystal silicon.

6. The fuse as claimed in claim 1, said second layer being formed epitaxially.

7. The fuse as claimed in claim 1, said second layer including Ge having a concentration of Ge in a range of approximately 5% to approximately 50%.

8. The fuse as claimed in claim 1, said first, second and third layers being located within the fuse link region disposed between and electrically connecting a first contact region to a second contact region.

9. The fuse as claimed in claim 1, wherein oxide liners are disposed between said STI regions and said first, second and third layers.

10. A semiconductor structure comprising:
    a substrate and an insulating layer located on said substrate;
    a fuse comprising a stack, from bottom to top, of a first layer, a second layer, and a third layer, wherein said fuse is located on and above said insulating layer; and
    a patterned STI region comprising an oxide material, wherein contiguous sidewalls of said patterned STI region laterally surrounds an entire periphery of said fuse, wherein said first layer includes a single crystal silicon and is located on and above said insulating layer, said second layer includes a single crystal silicon germanium and is located on and above said first layer, and said third layer includes a silicide and is located on and above said second layer.

11. The semiconductor structure of claim 10, further comprising an oxide liner, wherein inner sidewalls of said oxide liner contacts sidewalls of said first layer, said second layer, and said third layer, and outer sidewalls of said oxide liner contacts said contiguous sidewalls of said patterned STI region.

12. The semiconductor structure of claim 10, wherein said second layer is in direct contact with an upper surface of said first layer, and said third layer is in direct contact with an upper surface of said second layer.

13. The semiconductor structure of claim 12, wherein said first layer is in direct contact with an upper surface of said insulator layer.

14. The semiconductor structure of claim 10, wherein said fuse comprises a fuse link region, a first contact region located at one end of said fuse link region, and a second contact region located at another end of said fuse link region.

15. The semiconductor structure of claim 14, wherein each of said fuse link region, said first contact region, and said second contact region includes a portion of said first layer, a portion of said second layer, and a portion of said third layer.

16. The semiconductor structure of claim 10, wherein said second layer consists essentially of said single crystal silicon germanium.

17. The semiconductor structure of claim 16, wherein said first layer consists essentially of said single crystal silicon, and said third layer consists essentially of said silicide.

* * * * *